(12) United States Patent
Lee et al.

(10) Patent No.: US 12,021,040 B2
(45) Date of Patent: Jun. 25, 2024

(54) OVERLAY MARK FORMING MOIRE PATTERN, OVERLAY MEASUREMENT METHOD USING SAME, AND MANUFACTURING METHOD OF SEMICONDUCTOR DEVICE USING SAME

(71) Applicant: AUROS TECHNOLOGY, INC., Hwaseong-si (KR)

(72) Inventors: Hyun Chul Lee, Hwaseong-si (KR); Hyun Jin Chang, Seoul (KR); Sung Hoon Hong, Incheon (KR); Young Je Woo, Seoul (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 18/314,433

(22) Filed: May 9, 2023

(65) Prior Publication Data
US 2023/0282597 A1 Sep. 7, 2023

Related U.S. Application Data

(63) Continuation of application No. PCT/KR2022/016026, filed on Oct. 20, 2022.

(30) Foreign Application Priority Data

Jan. 20, 2022 (KR) .................. 10-2022-0008304

(51) Int. Cl.
*H01L 23/544* (2006.01)
*G03F 1/42* (2012.01)
(Continued)

(52) U.S. Cl.
CPC .............. *H01L 23/544* (2013.01); *G03F 1/42* (2013.01); *G03F 7/20* (2013.01); *G03F 7/70633* (2013.01);
(Continued)

(58) Field of Classification Search
CPC ............... H01L 23/544; H01L 22/12; H01L 2223/54426; G03F 1/42; G03F 7/20; G03F 7/70633; G03F 7/70683
See application file for complete search history.

(56) References Cited

U.S. PATENT DOCUMENTS 9,709,903 B2 * 7/2017 Choi .................. G03F 7/70633
9,846,359 B1 * 12/2017 Oh ...................... G03F 7/70683
(Continued)

FOREIGN PATENT DOCUMENTS

CN 106030414 B 10/2018
JP 2020-112807 A 7/2020
(Continued)

*Primary Examiner* — Bilkis Jahan
*Assistant Examiner* — Victor V Barzykin
(74) *Attorney, Agent, or Firm* — NKL LAW; Jae Youn Kim

(57) ABSTRACT

An overlay mark, an overlay measurement method using the same, and a manufacturing method of a semiconductor device using the same are provided. The overlay mark is for measuring an overlay based on an image, is configured to determine a relative misalignment between at least two pattern layers, and includes first to fourth overlay marks. The first overlay mark has a pair of first Moire patterns disposed on a center portion of the overlay mark. The second overlay mark has a pair of second Moire patterns disposed so as to face each other with the first Moire patterns interposed therebetween. The third overlay mark has a pair of third Moire patterns disposed on a first diagonal line with the first Moire patterns interposed therebetween. The fourth overlay mark has a pair of fourth Moire patterns disposed on a second diagonal line with the first Moire patterns interposed therebetween.

12 Claims, 7 Drawing Sheets

(51) Int. Cl.
*G03F 7/00* (2006.01)
*G03F 7/20* (2006.01)
*H01L 21/66* (2006.01)

(52) U.S. Cl.
CPC .......... *G03F 7/70683* (2013.01); *H01L 22/12* (2013.01); *H01L 2223/54426* (2013.01)

(56) References Cited

U.S. PATENT DOCUMENTS

| | | | |
|---|---|---|---|
| 10,379,445 B2 | 8/2019 | Jak et al. | |
| 11,604,149 B2* | 3/2023 | Feler | G01N 21/9501 |
| 2004/0233443 A1* | 11/2004 | Mieher | G03F 9/7088 |
| | | | 356/401 |
| 2006/0250597 A1* | 11/2006 | Nakajima | G03F 9/7049 |
| | | | 355/53 |
| 2008/0034344 A1* | 2/2008 | Chiu | G03F 7/70633 |
| | | | 430/5 |
| 2012/0033215 A1* | 2/2012 | Kandel | G03F 7/70633 |
| | | | 356/366 |
| 2013/0107259 A1* | 5/2013 | Choi | G03F 7/70633 |
| | | | 257/E23.179 |
| 2017/0357154 A1* | 12/2017 | Oh | G01B 11/005 |
| 2018/0172514 A1* | 6/2018 | Wu | G03F 9/7065 |
| 2019/0219930 A1* | 7/2019 | Yang | G03F 9/7049 |
| 2021/0072650 A1* | 3/2021 | Feler | G06T 7/68 |
| 2022/0214625 A1* | 7/2022 | Gronheid | G03F 7/70633 |

FOREIGN PATENT DOCUMENTS

| | | |
|---|---|---|
| KR | 100225230 B1 | 10/1999 |
| KR | 10-2000-0006182 A | 1/2000 |
| KR | 20140096331 A | 8/2014 |
| KR | 20150013428 A | 2/2015 |
| KR | 10-1604789 B1 | 3/2016 |
| KR | 20170141312 A | 12/2017 |
| KR | 101906098 B1 | 10/2018 |
| KR | 20220003907 A | 1/2022 |
| TW | 202132926 A | 9/2021 |

* cited by examiner

OVERLAY MARK FORMING MOIRE PATTERN, OVERLAY MEASUREMENT METHOD USING SAME, AND MANUFACTURING METHOD OF SEMICONDUCTOR DEVICE USING SAME

CROSS REFERENCE TO RELATED APPLICATION

The present application claims priority to Korean Patent Application No. 10-2022-0008304, filed Jan. 20, 2022, the entire contents of which are incorporated herein for all purposes by this reference.

BACKGROUND OF THE INVENTION

Field of the Invention

The present disclosure relates to an overlay mark forming a Moire pattern, an overlay measurement method using the overlay mark, and a manufacturing method of a semiconductor device using the overlay mark.

Description of the Related Art

On a substrate of a semiconductor, a plurality of pattern layers is sequentially formed. In addition, by performing double patterning and so on, a circuit of one layer in which the circuit is divided into two patterns is formed. A desired semiconductor device may be manufactured only when pattern layers or a plurality of patterns in one layer is formed accurately at a predetermined position on a substrate of the semiconductor (semiconductor substrate).

Therefore, in order to check that the pattern layers are accurately aligned, overlay marks, formed simultaneously with the pattern layers, are used.

A method of measuring an overlay by using an overlay mark is as follows. Firstly, on a pattern layer that is formed in a previous process such as an etching process for example, one structure that is a part of an overlay mark (overlay structure of the pattern layer) is formed simultaneously with the formation of the pattern layer. Then, in a subsequent process such as a photo-lithography process for example, the other structure of the overlay mark (overlay structure of the photoresist layer) is formed on a photoresist.

Then, an image (obtaining the image by passing light through a photoresist layer) of the overlay structure of the pattern layer and an image of the overlay structure of the photoresist layer in which the overlay structures are formed are obtained by using an overlay measurement apparatus. The overlay measurement apparatus measures an overlay value by measuring an offset value between centers of the images.

More specifically, in Japanese Patent Application Publication No. 2020-112807, a method of determining a relative misalignment between different layers or between different patterns is disclosed, in which the method is performed by capturing an image of an overlay mark formed on a substrate, selecting a plurality of working zones in the captured image, forming signals having information about selected working zones, respectively, and comparing the signals.

In addition, in Korean Patent No. 10-1604789, an overlay measurement method is disclosed, in which the method is performed by obtaining an image of an overlay mark; obtaining a 180 degrees rotated image of the overlay mark with respect to a center of the secured image; comparing the two images; setting a center of a current image as a center of the overlay mark when the two images coincide with each other; and when the two images do not coincide with each other, repeatedly changing positions, obtaining an image of the overlay mark, obtaining a 180 degrees rotated image of the overlay mark with respect to a center of the secured image, comparing the two images until the two images coincide with each other so that a center of a current image can now be set as the center of the of the overlay mark.

In addition, in Korean Patent Application Publication No. 10-2000-0006182, a method of measuring an overlay is disclosed, in which the method is performed by forming a Moire pattern using repetitive overlay marks overlapping each other, observing the Moire pattern optically, and comparing the Moire pattern in an aligned state with the observed Moire pattern.

In addition, in U.S. Patent Application Publication No. 2021-0072650A1, a method of measuring an overlay in an X-axis direction and a Y-axis direction is disclosed, in which the method is performed by forming and using four pairs of Moire patterns that are rotationally symmetrical by 180 degrees by using one-dimensional grating patterns in the X-axis direction and one-dimensional grating patterns in the Y-axis direction that overlap each other.

Such a method using images of Moire patterns has an advantage of being more useful than the method using an image of an overlay mark in that the method using the images of the Moire patterns amplifies and indicates misalignment between layers. However, there is a problem. Noise is generated on a Moire pattern due to one or more influences such as interference by light reflected from the overlay mark formed on a current layer.

In addition, since each of Moire patterns illustrated in U.S. Patent Application Publication No. 2021-0072650A1 is formed over a long area from a center of an overlay mark to an outer portion of the overlay mark, there is another problem. An overlay measurement apparatus may be significantly affected by optical aberration due to an inclined optical element of an overlay measurement apparatus such as a beam splitter for example. Particularly, Moire patterns which are used for measuring an overlay in a specific direction and which have a large change in a distance to an optical system along a direction in which bars are aligned have a large difference between a light path to the bars close to the center of the overlay mark and a light path to the bars placed on an outer portion, so that the Moire patterns are significantly affected by optical aberration.

In addition, when an overlay mark is formed by using an exposure apparatus in a scanner type, Moire patterns disposed along a scanning direction have a small deviation, and Moire patterns disposed along a direction orthogonal to the scanning direction have a large deviation, but Moire patterns in a conventional overlay mark are disposed regardless of the scanning direction, so that there is a problem that the deviation of the Moire patterns disposed along the direction orthogonal to the scanning direction may affect an overlay measurement process.

DOCUMENT OF RELATED ART (Patent Document 1) Japanese Patent Application Publication No. 2020-112807
(Patent Document 2) Korean Patent No. 10-1604789
(Patent Document 3) Korean Patent Application Publication No. 10-2000-0006182

(Patent Document 4) U.S. Patent Application Publication No. 2021-0072650A1

SUMMARY OF THE INVENTION

Accordingly, one or more embodiments of the present disclosure are directed toward solving the above problems occurring in the related art. In one or more embodiments, the present disclosure provides an overlay mark capable of minimizing influence of optical aberration, an overlay measurement method using the overlay mark in which the method is a new method, and a manufacturing method of a semiconductor device using the overlay mark.

In addition, in one or more embodiments, the present disclosure provides an overlay mark capable of minimizing influence according to a scanning direction of a scanner, an overlay measurement method using the overlay mark in which the method is a new method, and a manufacturing method of a semiconductor device using the overlay mark.

In one or more embodiments of the present disclosure, there is provided an overlay mark for measuring an overlay based on an image, the overlay mark being configured to determine a relative misalignment between at least two pattern layers, and the overlay mark including: first to fourth overlay marks, wherein the first overlay mark is configured such that a pair of first Moire patterns is formed, the pair of first Moire patterns having a first center of symmetry and being rotationally symmetrical by 180 degrees with respect to the first center of symmetry, and the pair of first Moire patterns having central axes that coincide with each other and being disposed on a center portion of the overlay mark. The first Moire patterns are formed by a first grating pattern, which is formed together with a first pattern layer and which has a first pitch along a first direction, and by a second grating pattern, which is formed together with a second pattern layer so as to overlap the first grating pattern and which has a second pitch along the first direction in which the second pitch is different from the first pitch.

The second overlay mark is configured such that a pair of second Moire patterns is formed, the pair of second Moire patterns having a second center of symmetry and being rotationally symmetrical by 180 degrees with respect to the second center of symmetry, and the pair of second Moire patterns having central axes that coincide with each other and being disposed so as to face each other with the first Moire patterns interposed therebetween, and the second Moire patterns are formed by a third grating pattern, which is formed together with the first pattern layer and which has a third pitch along the first direction, and by a fourth grating pattern, which is formed together with the second pattern layer so as to overlap the third grating pattern and which has a fourth pitch along the first direction in which the fourth pitch is different from the third pitch.

The third overlay mark is configured such that a pair of third Moire patterns is formed, the pair of third Moire patterns having a third center of symmetry and being rotationally symmetrical by 180 degrees with respect to the third center of symmetry, and the pair of third Moire patterns being disposed on a first diagonal line with the first Moire patterns interposed therebetween. The third Moire patterns are formed by a fifth grating pattern, which is formed together with the first pattern layer and which has a fifth pitch along a second direction, and by a sixth grating pattern, which is formed together with the second pattern layer so as to overlap the fifth grating pattern and which has a sixth pitch along the second direction in which the sixth pitch is different from the fifth pitch.

The fourth overlay mark is configured such that a pair of fourth Moire patterns is formed, the pair of fourth Moire patterns having a fourth center of symmetry and being rotationally symmetrical by 180 degrees with respect to the fourth center of symmetry, and the pair of fourth Moire patterns being disposed on a second diagonal line with the first Moire patterns interposed therebetween in which the second diagonal line crosses the first diagonal line. The fourth Moire patterns are formed by a seventh grating pattern, which is formed together with the first pattern layer and which has a seventh pitch along the second direction, and by an eighth grating pattern, which is formed together with the second pattern layer so as to overlap the seventh grating pattern and which has an eight pitch along the second direction in which the eighth pitch is different from the seventh pitch.

An error in the first direction between the first center of symmetry and the second center of symmetry represents an overlay error in the first direction between the first pattern layer and the second pattern layer.

An error in the second direction between the third center of symmetry and the fourth center of symmetry represents an overlay error in the second direction between the first pattern layer and the second pattern layer.

The overlay mark may be formed by using an exposure apparatus in a scanner type, and the second direction may be parallel to a scanning direction of the exposure apparatus.

Pitches of the first to the fourth Moire patterns may be larger than an optical resolution of an overlay measurement apparatus, and the first to the eighth pitches of the first to eighth grating patterns may be smaller than the optical resolution of the overlay measurement apparatus.

The first pitch may be the same as the fourth pitch, and the second pitch may be the same as the third pitch.

The fifth pitch may be the same as the eighth pitch, and the sixth pitch may be the same as the seventh pitch.

In one or more embodiments, the present disclosure provides an overlay measurement method measuring an overlay between a plurality of consecutive pattern layers, the overlay measurement method including: obtaining a Moire pattern image formed by an overlay mark that is formed simultaneously with forming the plurality of consecutive pattern layers; and analyzing the Moire pattern image, wherein the overlay mark may be an overlay mark described above.

In addition, the obtaining the Moire pattern image may include obtaining the Moire pattern image by using an overlay measurement apparatus including an inclined optical element, and the overlay measurement apparatus may be arranged such that a distance between the inclined optical element and the overlay mark increases or decreases in the first direction and the distance is constant in the second direction.

The inclined optical element may be a beam splitter.

The analyzing the Moire pattern image may include: obtaining a periodic graph by one-dimensionally projecting a part of the Moire pattern image; and expressing the periodic graph as a sine wave.

The expressing the periodic graph as the sine wave may include fitting $A_0$, $A_1$, $A_2$, $\theta_1$, $\theta_2$, $f_1$, and $f_2$ values of the equation $$A_0 + A_1 \cos(\theta_1 + f_1 x) + A_2 \sin(\theta_2 + f_2 x)$$

through a regression analysis so that a difference between the periodic graph and the sine wave expressed by the equation is reduced, where $A_1 \cos(\theta_1 + f_1 x)$ denotes cosine sinusoidal signal model, $A_2 \sin(\theta_2 + f_2 x)$ denotes sine sinusoidal signal model, $A_O$ denotes direct current (DC) corresponding to the height of the waveform, $A_1$ denotes amplitude associated with cosine sinusoidal signal model, $A_2$ denotes amplitude associated with sine sinusoidal signal model, $\theta_1$ denotes phase associated with cosine sinusoidal signal model, $\theta_2$ denotes phase associated with sine sinusoidal signal model, $f_1$ denotes frequency associated with cosine sinusoidal signal model, $f_2$ denotes frequency associated with sine sinusoidal signal model, and x denotes pixel position.

This overlay measurement method has an advantage of being able to stably obtain a low-frequency component of a Moire pattern from which a high-frequency component of an existing pattern is removed by performing the fitting process.

In one or more embodiments, there is provided a manufacturing method of a semiconductor device, the manufacturing method including: forming an overlay mark simultaneously with forming a plurality of consecutive pattern layers; measuring an overlay value by using the overlay mark; and using the measured overlay value to control the forming the plurality of consecutive pattern layers, wherein the overlay mark may be the overlay mark described above.

The forming the overlay mark may include forming the overlay mark by using an exposure apparatus in a scanner type, and the second direction may be parallel to a scanning direction of the exposure apparatus.

In the overlay mark, the new overlay measurement method using the overlay mark, and the manufacturing method of the semiconductor device according to the present disclosure, there is an advantage that influence of optical aberration may be minimized.

In addition, influence according to the scanning direction of the scanner may be minimized.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
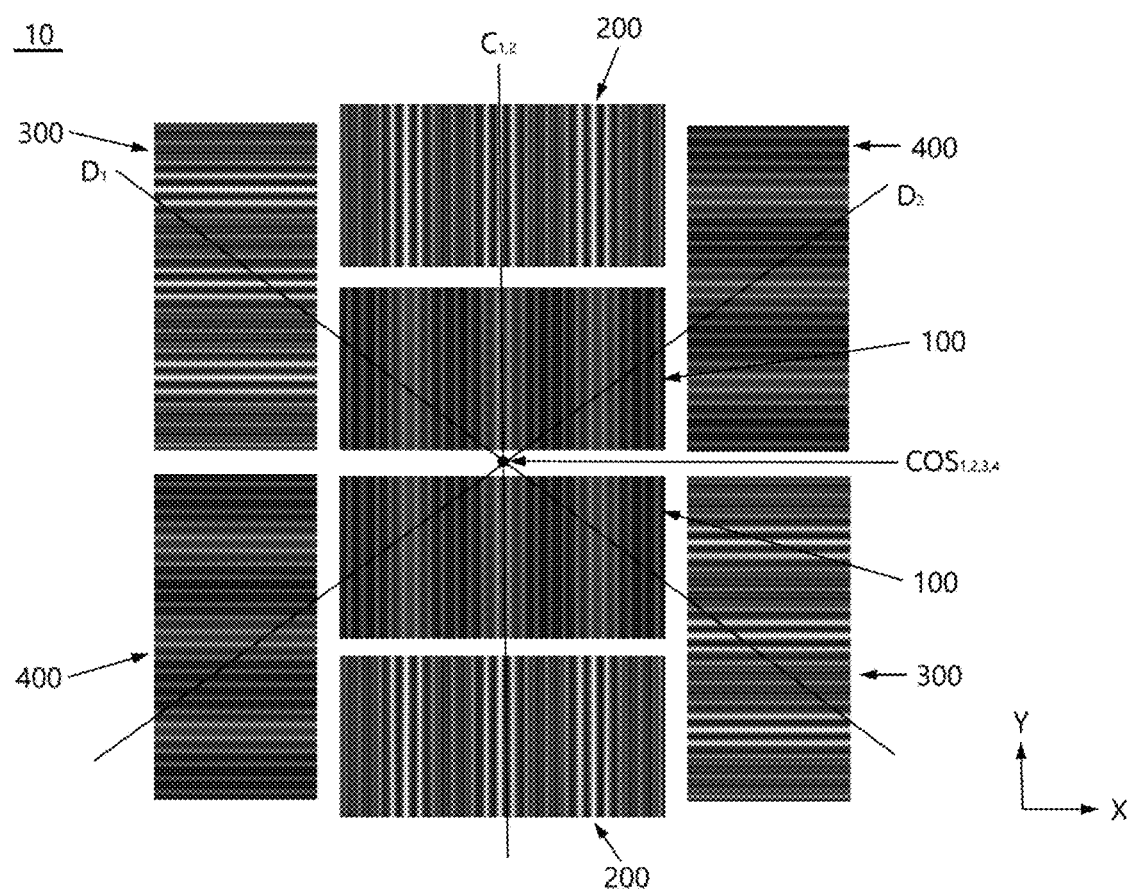
FIG. 1 is a plan view illustrating an embodiment of an overlay mark according to the present disclosure.

Hereinafter, embodiments of the present disclosure will be described in detail with reference to the accompanying drawings. However, the embodiments of the present disclosure may be modified into various other forms, and the scope of the present disclosure should not be construed as being limited to the embodiments described below. Embodiments of the present disclosure are provided to more completely describe the present disclosure to those of ordinary skill in the art. Accordingly, the shapes of elements in the drawings are exaggerated in order to emphasize a clearer description. The elements indicated by the same reference numerals in the drawings mean the same elements.

Figure 4:
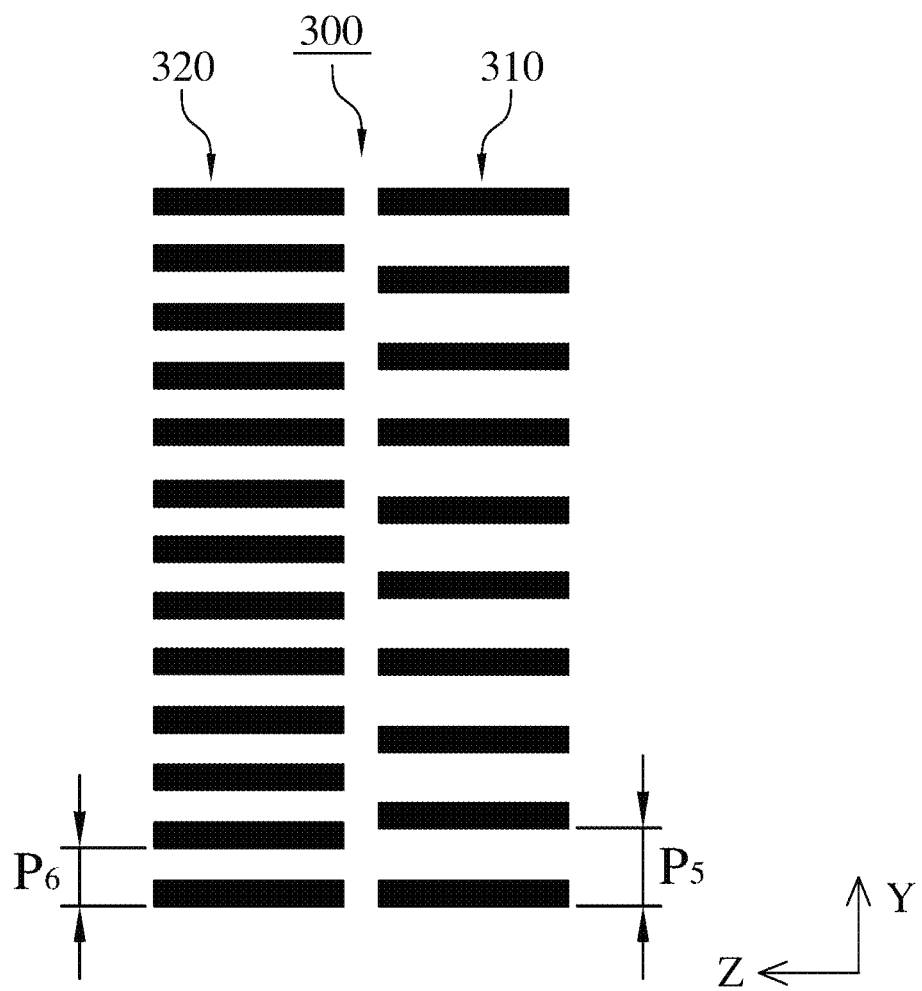
FIG. 4 is a cross-sectional view illustrating a part of a third overlay mark illustrated in FIG. 1.
Figure 5:
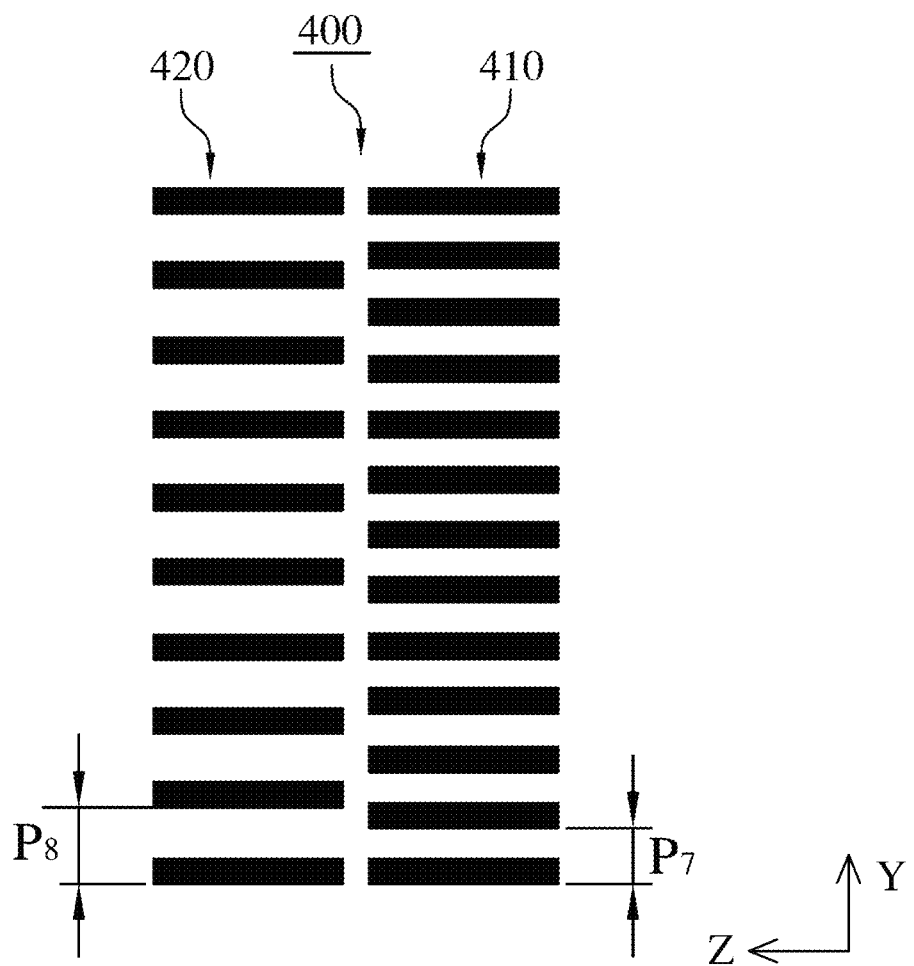
FIG. 5 is a cross-sectional view illustrating a part of a fourth overlay mark illustrated in FIG. 1.
Figure 6:
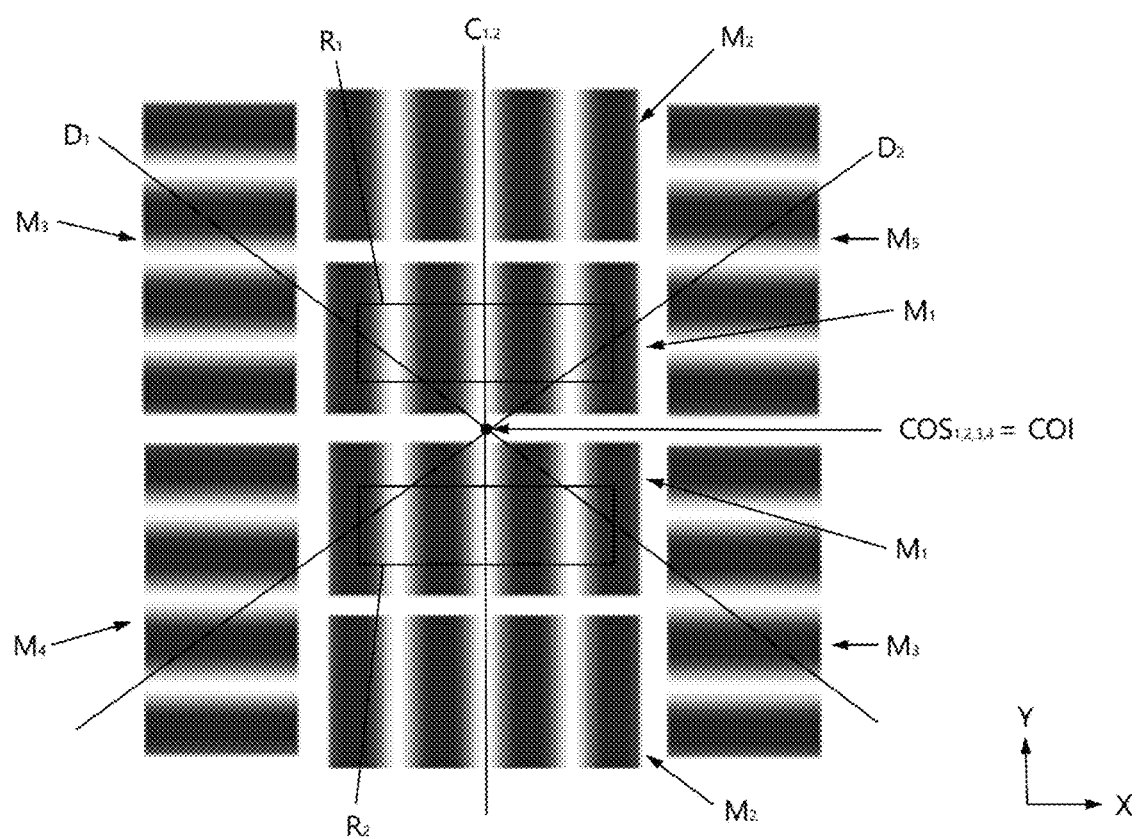
FIG. 6 is a view illustrating a simulation result of a Moire pattern formed when light is irradiated onto the overlay mark illustrated in FIG. 1.

FIG. 1 is a plan view illustrating an embodiment of an overlay mark according to the present disclosure, FIGS. 2 to 5 are cross-sectional views illustrating parts of first to fourth overlay marks, and FIG. 6 is a view illustrating a simulation result of a Moire pattern that is formed when light is irradiated onto the overlay mark illustrated in FIG. 1. FIG. 1 illustrates a state in which first to fourth overlay marks 100, 200, 300, and 400 are aligned.

Figure 2:
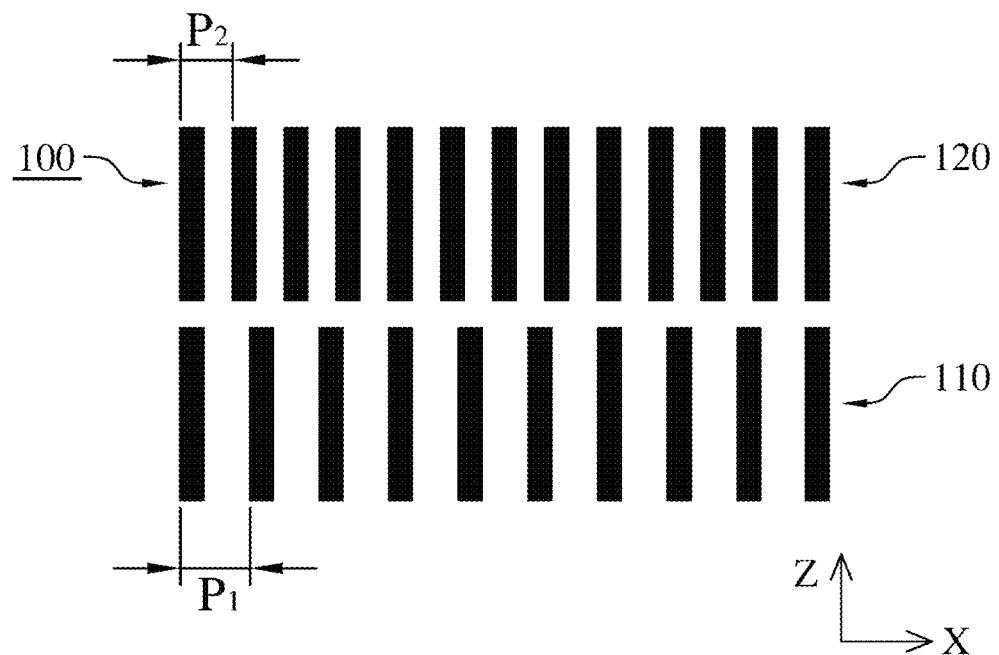
FIG. 2 is a cross-sectional view illustrating a part of a first overlay mark illustrated in FIG. 1.

As illustrated in FIGS. 1 and 2, the first overlay mark 100 is provided with a pair of first grating patterns 110 and a pair of second grating patterns 120 that are disposed on a center portion of an overlay mark 10. The pair of first grating patterns 110 is formed side by side at regular intervals. The pair of second grating patterns 120 is formed such that the pair of second grating patterns 120 overlaps the pair of first grating patterns 110. The pair of second grating patterns 120 is formed side by side at regular intervals.

The first grating pattern 110 is formed together with a first pattern layer (a lower layer). The first grating pattern 110 has a first pitch $P_1$ along a first direction (an X-axis direction in FIG. 1). The first grating pattern 110 has a plurality of thin bars.

The second grating pattern 120 is formed together with a second pattern layer (an upper layer). The second grating pattern 120 has a second pitch $P_2$ along the first direction (the X-axis direction in FIG. 1). Here, the second pitch $P_2$ is different from the first pitch $P_1$. The second grating pattern 120 has a plurality of thin bars.

The first grating pattern 110 and the second grating pattern 120 form a pair of first Moire patterns $M_1$ on the center portion of the overlay mark 10. That is, when light is irradiated onto the first and second grating patterns 110 and 120, the first Moire pattern $M_1$ as illustrated in FIG. 6 is formed by an interference phenomenon that occurs when periodic patterns overlap.

At this time, as shown in Equation 1 below, a pitch $P_{M1}$ of the first Moire pattern $M_1$ is determined by the first pitch $P_1$ of the first grating pattern 110 and the second pitch $P_2$ of the second grating pattern 120. As can be seen in Equation 1, the pitch $P_{M1}$ of the first Moire pattern $M_1$ is much larger than the first pitch $P_1$ of the first grating pattern 110 and the second pitch $P_2$ of the second grating pattern 120.

$$P_{M_1} = \frac{P_1 P_2}{(P_1 - P_2)} \qquad \text{[Equation 1]}$$

Preferably, the pitch $P_{M1}$ of the first Moire pattern $M_1$ is larger than an optical resolution of an overlay measurement apparatus, and preferably, the first pitch $P_1$ of the first grating pattern 110 and the second pitch $P_2$ of the second grating pattern 120 are smaller than the optical resolution of the overlay measurement apparatus. This is to minimize occurrence of noise in a Moire pattern by various factors such as interference by light reflected from the grating patterns 110 and 120, particularly, the second grating pattern 120.

In addition, a relative movement of the second grating pattern 120 relative to the first grating pattern 110 in a grating element alignment direction (the X-axis direction in the embodiment) causes a movement of the first Moire pattern $M_1$. In addition, a first Moire gain $G_{M1}$ that is a ratio of a relative movement distance of the second grating pattern 120 and a movement distance of the first Moire pattern $M_1$ is determined by Equation 2 below.

$$G_{M_1} = \frac{P_1}{(P_1 - P_2)} \quad \text{[Equation 2]}$$

As can be seen in Equation 2, even if the second grating pattern 120 moves slightly, the first Moire pattern $M_1$ moves a relatively much longer distance. Therefore, a fine overlay error is capable of being measured through an image of a Moire pattern.

The first Moire patterns $M_1$ are provided with a first center of symmetry $COS_1$. The first Moire patterns $M_1$ are rotationally symmetrical by 180 degrees with respect to the first center of symmetry $COS_1$. Central axes $C_1$ of the first Moire patterns $M_1$ coincide with each other.

Figure 3:
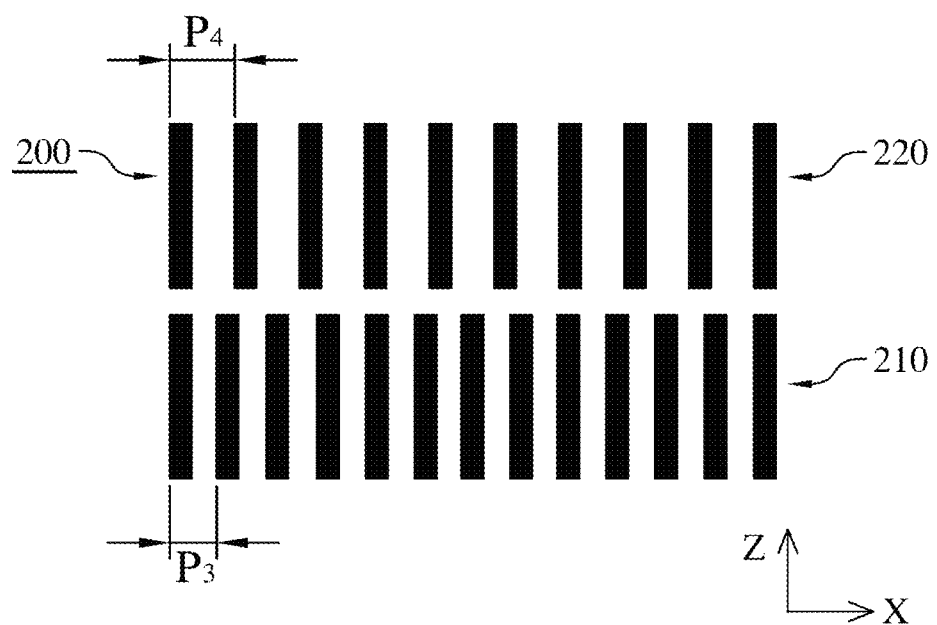
FIG. 3 is a cross-sectional view illustrating a part of a second overlay mark illustrated in FIG. 1.

As illustrated in FIGS. 1 and 3, the second overlay mark 200 is provided with a pair of third grating patterns 210 disposed so as to face each other with the first grating patterns 110 interposed therebetween, and is provided with a pair of fourth grating patterns 220 disposed so as to face each other with the second grating patterns 120 interposed therebetween. The pair of fourth grating patterns 220 is formed such that the pair of fourth grating patterns 220 overlaps the pair of third grating patterns 210.

The third grating pattern 210 is formed together with the first pattern layer. The third grating pattern 210 has a third pitch $P_3$ along the first direction (the X-axis direction in FIG. 1). The third grating pattern 210 has a plurality of thin bars.

The fourth grating pattern 220 is formed together with the second pattern layer. The fourth grating pattern 220 has a fourth pitch $P_4$ along the first direction (the X-axis direction in FIG. 1). Here, the fourth pitch $P_4$ is different from the third pitch $P_3$. The fourth grating pattern 220 has a plurality of thin bars. Here, the fourth pitch $P_4$ may be the same as the first pitch $P_1$, and the third pitch $P_3$ may be the same as the second pitch $P_2$.

As illustrated in FIG. 6, the third grating pattern 210 and the fourth grating pattern 220 form a pair of second Moire patterns $M_2$ that is disposed so as to face each other with the first Moire patterns $M_1$ interposed therebetween.

As shown in Equation 3 below, a pitch $P_{M2}$ of the second Moire pattern $M_2$ is determined by the third pitch $P_3$ of the third grating pattern 210 and the fourth pitch $P_4$ of the fourth grating pattern 220.

$$P_{M_2} = \frac{P_3 P_4}{(P_3 - P_4)} \quad \text{[Equation 3]}$$

In addition, a second Moire gain $G_{M2}$ that is a ratio of a relative movement distance of the fourth grating pattern 220 and a movement distance of the second Moire pattern $M_2$ is determined by Equation 4 below.

Preferably, the pitch $P_{M2}$ of the second Moire pattern $M_2$ is larger than the optical resolution of the overlay measurement apparatus, and preferably, the third pitch $P_3$ of the third grating pattern 210 and the fourth pitch $P_4$ of the fourth grating pattern 220 are smaller than the optical resolution of the overlay measurement apparatus. This is to minimize the occurrence of noise in the Moire pattern due to the influence of interference by light reflected from the grating pattern.

$$G_{M_2} = \frac{P_3}{(P_3 - P_4)} \quad \text{[Equation 4]}$$

As can be seen in Equation 4, even if the fourth grating pattern 220 moves slightly, the second Moire pattern $M_2$ moves a relatively much longer distance.

The second Moire patterns $M_2$ are provided with a second center of symmetry $COS_2$. The second Moire patterns $M_2$ are rotationally symmetrical by 180 degrees with respect to the second center of symmetry $COS_2$. Central axes $C_2$ of the second Moire patterns $M_2$ coincide with each other. When the overlay mark 10 is aligned, the central axes $C_1$ of the first Moire patterns $M_1$ and the central axes $C_2$ of the second Moire patterns $M_2$ coincide with each other.

In FIG. 6, the overlay mark 10 is in an aligned state, so that the first center of symmetry $COS_1$ of the first Moire patterns $M_1$ and the second center of symmetry $COS_2$ of the second Moire patterns $M_2$ coincide with each other.

When the overlay mark 10 is not in the aligned state, the first center of symmetry COST of the first Moire patterns $M_1$ and the second center of symmetry $COS_2$ of the second Moire patterns $M_2$ do not coincide with each other.

By using a difference between the first center of symmetry COST of the first Moire patterns $M_1$ and the second center of symmetry $COS_2$ of the second Moire patterns $M_2$ in the first direction (the X-axis direction), an overlay error in the first direction may be measured.

As illustrated in FIGS. 1 and 4, the third overlay mark 300 is provided with a pair of fifth grating patterns 310 that is disposed on a first diagonal line $D_1$ so as to face each other with the first grating patterns 110 interposed therebetween, and is provided with a pair of sixth grating patterns 320 that is disposed on the first diagonal line $D_1$ so as to face each other with the second grating patterns 120 interposed therebetween. The pair of sixth grating patterns 320 is formed such that the pair of sixth grating patterns 320 overlaps the pair of fifth grating patterns 310.

The fifth grating pattern 310 is formed together with the first pattern layer. The fifth grating pattern 310 has a fifth pitch $P_5$ along a second direction (a Y-axis direction in FIG. 1). The fifth grating pattern 310 has a plurality of thin bars.

The sixth grating pattern 320 is formed together with the second pattern layer. The sixth grating pattern 320 has a sixth pitch $P_6$ along the second direction (the Y-axis direction in FIG. 1). Here, the sixth pitch $P_6$ is different from the fifth pitch $P_5$. The sixth grating pattern 320 has a plurality of thin bars.

As illustrated in FIG. 6, the fifth grating pattern 310 and the sixth grating pattern 320 form a pair of third Moire patterns $M_3$ that is disposed on the first diagonal line $D_1$ so as to face each other with the first Moire patterns M1 interposed therebetween. That is, when light is irradiated onto the fifth and sixth grating patterns 310 and 320, the third Moire pattern $M_3$ as illustrated in FIG. 6 is formed by an interference phenomenon that occurs when periodic patterns overlap.

At this time, as shown in Equation 5 below, a pitch $P_{M3}$ of the third Moire pattern $M_3$ is determined by the fifth pitch $P_5$ of the fifth grating pattern 310 and the sixth pitch $P_6$ of the sixth grating pattern 320. As can be seen in Equation 5, the pitch $P_{M3}$ of the third Moire pattern $M_3$ is much larger than the fifth pitch $P_5$ of the fifth grating pattern 310 and the sixth pitch $P_6$ of the sixth grating pattern 320.

$$P_{M_3} = \frac{P_5 P_6}{(P_5 - P_6)} \quad \text{[Equation 5]}$$

Preferably, the pitch $P_{M3}$ of the third Moire pattern $M_3$ is larger than the optical resolution of the overlay measurement apparatus, and preferably, that the fifth pitch $P_5$ of the fifth grating pattern 310 and the sixth pitch $P_6$ of the sixth grating pattern 320 are smaller than the optical resolution of the overlay measurement apparatus. This is to minimize the occurrence of noise in the Moire pattern due to the influence of interference by light reflected from the grating pattern.

In addition, a relative movement of the sixth grating pattern 320 relative to the fifth grating pattern 310 in a grating element arrangement direction causes a movement of the third Moire pattern $M_3$. In addition, a third Moire gain $G_{M3}$ that is a ratio of a relative movement distance of the sixth grating pattern 320 and a movement distance of the third Moire pattern $M_3$ is determined by Equation 6 below.

$$G_{M_3} \frac{P_5}{(P_5 - P_6)} \quad \text{[Equation 6]}$$

As can be seen in Equation 6, even if the sixth grating pattern 320 moves slightly, the third Moire pattern $M_3$ moves a relatively much longer distance. Therefore, a fine overlay error is capable of being measured through an image of a Moire pattern.

The third Moire patterns $M_3$ are provided with a third center of symmetry $COS_3$. The third Moire patterns $M_3$ are rotationally symmetrical by 180 degrees with respect to the third center of symmetry $COS_3$.

As illustrated in FIGS. 1 and 5, the fourth overlay mark 400 is provided with a pair of seventh grating patterns 410 disposed on a second diagonal line $D_2$ crossing the first diagonal line $D_1$ so as to face each other with the first grating patterns 110 interposed therebetween, and is provided with a pair of eighth grating patterns 420 disposed on the second diagonal line $D_2$ so as to face each other with the second grating patterns 120 interposed therebetween. The pair of eighth grating patterns 420 is formed such that the pair of eighth grating patterns 420 overlaps the pair of seventh grating patterns 410.

The seventh grating pattern 410 is formed together with the first pattern layer. The seventh grating pattern 410 has a seventh pitch $P_7$ along the second direction (the Y-axis direction in FIG. 1). The seventh grating pattern 410 has a plurality of thin bars.

The eighth grating pattern 420 is formed together with the second pattern layer. The eighth grating pattern 420 has an eighth pitch $P_8$ along the second direction (the Y-axis direction in FIG. 1). Here, the eighth pitch $P_8$ is different from the seventh pitch $P_7$. The eighth grating pattern 420 has a plurality of thin bars.

As illustrated in FIG. 6, the seventh grating pattern 410 and the eighth grating pattern 420 form a pair of fourth Moire patterns $M_4$ that is disposed on the second diagonal line $D_2$ so as to face each other with the first Moire patterns $M_1$ interposed therebetween. That is, when light is irradiated onto the seventh and eighth grating patterns 410 and 420, the fourth Moire pattern $M_4$ as illustrated in FIG. 6 is formed by an interference phenomenon that occurs when periodic patterns overlap.

At this time, as shown in Equation 7 below, a pitch $P_{M4}$ of the fourth Moire pattern $M_4$ is determined by the seventh pitch $P_7$ of the seventh grating pattern 410 and the eighth pitch $P_8$ of the eighth grating pattern 420. As can be seen in Equation 7, the pitch $P_{M4}$ of the fourth Moire pattern $M_4$ is much larger than the seventh pitch $P_7$ of the seventh grating pattern 410 and the eighth pitch $P_8$ of the eighth grating pattern 420.

$$P_{M_4} = \frac{P_7 P_8}{(P_7 - P_8)} \quad \text{[Equation 7]}$$

Preferably, the pitch $P_{M4}$ of the fourth Moire pattern $M_4$ is larger than the optical resolution of the overlay measurement apparatus, and preferably, the seventh pitch $P_7$ of the seventh grating pattern 410 and the eighth pitch $P_8$ of the eighth grating pattern 420 are smaller than the optical resolution of the overlay measurement apparatus. This is to minimize the occurrence of noise in the Moire pattern due to the influence of interference by light reflected from the grating pattern.

In addition, a relative movement of the eighth grating pattern 420 relative to the seventh grating pattern 410 in a grating element arrangement direction causes a movement of the fourth Moire pattern $M_4$. In addition, a fourth Moire gain $G_{M4}$ that is a ratio of a relative movement distance of the eighth grating pattern 420 and a movement distance of the fourth Moire pattern $M_4$ is determined by Equation 8 below.

$$G_{M_4} = \frac{P_7}{(P_7 - P_8)} \quad \text{[Equation 8]}$$

As can be seen in Equation 8, even if the eighth grating pattern 420 moves slightly, the fourth Moire pattern $M_4$ moves a relatively much longer distance. Therefore, a fine overlay error is capable of being measured through an image of a Moire pattern.

The fourth Moire patterns $M_4$ are provided with a fourth center of symmetry $COS_4$. The fourth Moire patterns $M_4$ are rotationally symmetrical by 180 degrees with respect to the fourth center of symmetry $COS_4$.

In FIG. 6, the overlay mark 10 is in the aligned state, so that the third center of symmetry $COS_3$ of the third Moire patterns $M_3$ and the fourth center of symmetry $COS_4$ of the fourth Moire patterns $M_4$ coincide with each other.

When the overlay mark 10 is not in the aligned state, the third center of symmetry $COS_3$ of the third Moire patterns $M_3$ and the fourth center of symmetry $COS_4$ of the fourth Moire patterns $M_4$ do not coincide with each other.

By using a difference between the third center of symmetry $COS_3$ of the third Moire patterns $M_3$ and the fourth center of symmetry $COS_4$ of the fourth Moire patterns $M_4$ in the second direction (the Y-axis direction), the overlay error in the second direction may be measured.

Hereinafter, an overlay measurement method using the overlay mark 10 described above will be described.

The overlay measurement method includes a process of obtaining a Moire pattern image formed by the overlay mark 10, and includes a process of analyzing the Moire pattern image. The overlay mark 10 is formed simultaneously when two consecutive pattern layers are formed.

The process of obtaining the Moire pattern image is a process of obtaining images of the first to the fourth Moire patterns $M_1$, $M_2$, $M_3$, and $M_4$ by using the overlay measurement apparatus. For example, the process is a process of obtaining an image as illustrated in FIG. 6.

This process may be a process of obtaining an overlay mark image by using an overlay measurement apparatus including an inclined optical element, a lens L, a stage S supporting a device Din which the overlay mark 10 is formed, and so on. For example, the inclined optical element may be a beam splitter BS.

Figure 7:
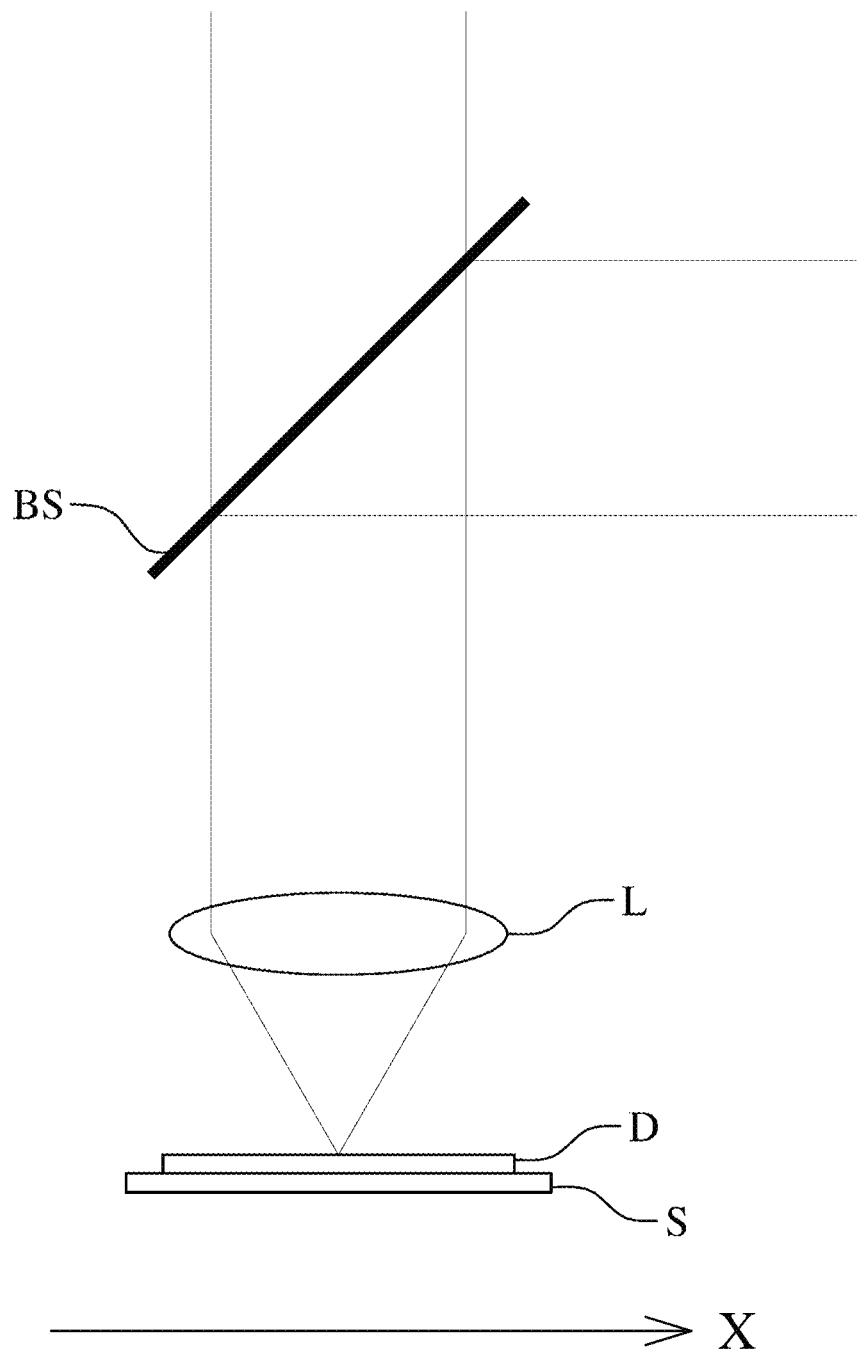
FIG. 7 is a view illustrating a process of obtaining a Moire pattern image.

FIG. 7 is a view illustrating a part of an example of an overlay measurement apparatus so as to describe a process of obtaining an overlay mark image. As illustrated in FIG. 7, preferably, in the obtaining process, the overlay measurement apparatus is disposed such that a distance between the beam splitter BS that is the inclined optical element and the device Din which the overlay mark 10 is formed increases or decreases as the distance progresses in the X-axis direction that is a direction in which the first Moire pattern $M_1$ and the second Moire pattern $M_2$ formed by the first overlay mark 100 and the second overlay mark 200 are disposed, and the distance is constant as the distance progresses in the Y-axis direction. That is, the beam splitter BS is disposed obliquely with respect to the X-axis.

When an overlay mark image is obtained while the overlay measurement apparatus is disposed in this manner, there is an advantage that influence of optical aberration is capable of being reduced. This is because the first overlay mark 100 and the second overlay mark 200 are formed only in the center of the overlay mark 10 with respect to the X-axis direction.

When an entire area of the overlay mark 10 is the same, widths in the X-axis direction of the first and the second overlay marks 100 and 200 are relatively narrow.

Therefore, a difference in a distance in a Z-axis direction between both ends in the X-axis direction and the beam splitter BS that is the inclined optical element is smaller than that of a conventional overlay mark. Therefore, influence of optical aberration due to the difference in the distance from the inclined optical element is minimized.

The third overlay mark 300 and the fourth overlay mark 400 are formed over an entire region of the overlay mark 10 in the Y-axis direction, but the beam splitter BS that is the inclined optical element is not disposed obliquely with respect to the Y-axis, so that distortion in the Y-axis direction is small. Therefore, the third Moire pattern $M_3$ and the fourth Moire pattern $M_4$ by the third overlay mark 300 and the fourth overlay mark 400 are hardly affected by optical aberration caused by the inclined optical element.

In the present disclosure, the first Moire pattern $M_1$ and the second Moire pattern $M_2$ disposed in one direction (the X-axis direction in FIG. 1) are collectively disposed in the center portion, and the overlay measurement apparatus is disposed such that the beam splitter BS that is the inclined optical element forms an angle with an axis (the X-axis in FIG. 7) in the direction considering when the image of the Moire pattern is obtained, so that influence of optical aberration is minimized.

The process of analyzing the Moire pattern image may include a process of measuring offsets of an X-axis direction center of the first Moire pattern $M_1$ and an X-axis direction center of the second Moire pattern $M_2$ from the obtained Moire pattern image, and may include a process of measuring offsets of a Y-axis direction center of the third Moire pattern $M_3$ and a Y-axis direction center of the fourth Moire pattern $M_4$ from the obtained Moire pattern image.

The process of measuring the offsets of the X-axis direction center of the first Moire pattern $M_1$ and the X-axis direction center of the second Moire pattern $M_2$ may include following processes.

Firstly, a difference between an X value of the first center of symmetry $COS_1$ of the first Moire pattern $M_1$ and an X value of a center of image COI of an obtained Moire pattern is obtained. In FIG. 6, the center of image COI is the center of the image area, and is not related to the center of symmetry of the Moire patterns. In FIG. 6, for the convenience, the center of image COI is illustrated as coincident with the first center of symmetry $COS_1$ of the first Moire pattern $M_1$.

As illustrated in FIG. 6, in the obtained Moire pattern image, a partial region $R_1$ of the first Moire pattern $M_1$ positioned at an upper side is selected. Then, a region $R_2$ that is symmetrical by 180 degrees with respect to the center of the secured Moire pattern image is also selected. The region $R_2$ is positioned at the other first Moire pattern $M_1$ positioned at a lower side.

Then, two-dimensional images of the selected two regions $R_1$ and $R_2$ are respectively projected in one dimension. That is, gray values of pixels having the same X value in the two-dimensional images are all added, an average of the gray values is calculated, or the gray values are normalized.

Figure 8:
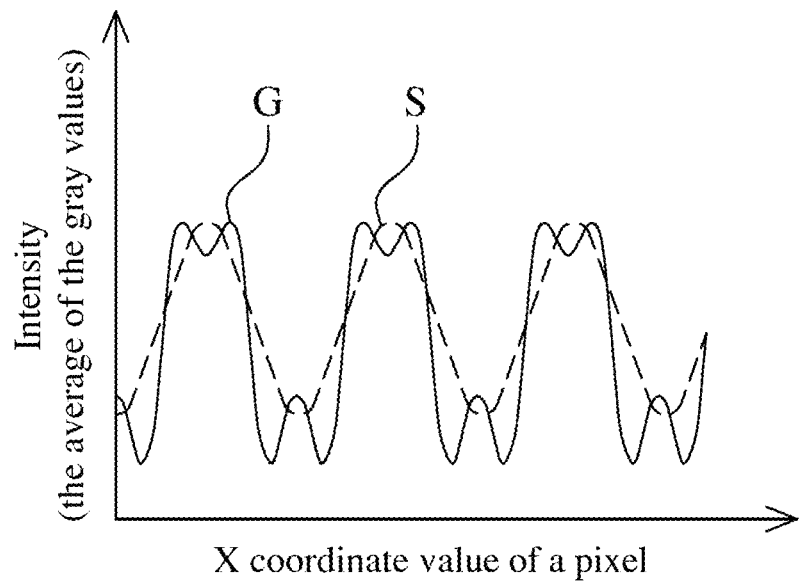
FIG. 8 is a graph illustrating a signal obtained from the overlay mark illustrated in FIG. 1.

Then, as illustrated in FIG. 8, a periodic graph G showing a change in gray values according to X values may be drawn. Since the gray value of the first Moire pattern $M_1$ differs according to the X value, the graph G shown in FIG. 8 may be secured. In FIG. 8, the X-axis is the X coordinate value of a pixel, and the Y-axis is a number between 0 and 255 based on 8 bits. The Y-axis value may be the average of the gray values (a number between 0 and 255 in the case of 8 bits) of pixels with the same coordinate value.

Figure 9:
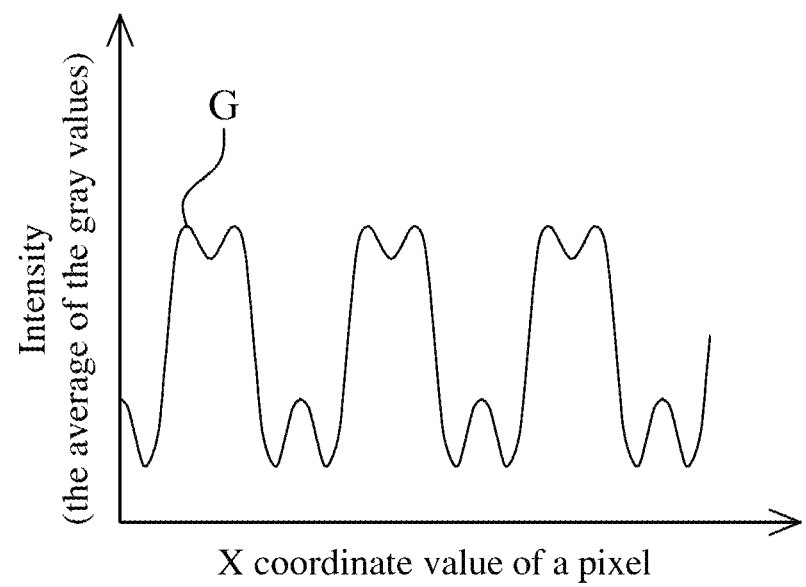
FIG. 9 is a graph illustrating a process of changing the signal illustrated in FIG. 8 to a sine wave.

As can be seen in FIG. 8, the secured periodic graph G contains a lot of noise. This noise may be noise generated by constructive interference caused by an actual grating pattern. Therefore, a high-frequency component of the periodic graph G in FIG. 8 is removed, and a sine wave S as shown in FIG. 9 is shown. In FIG. 9, the X-axis is the X coordinate value of a pixel, and the Y-axis is a number between 0 and 255 based on 8 bits. The Y-axis value may be the average of the gray values (a number between 0 and 255 in the case of 8 bits) of pixels with the same coordinate value.

A process of expressing the graph as a sine wave S may be a process of fitting $A_0$, $A_1$, $A_2$, $\theta_1$, $\theta_2$, and $f_2$ values of Equation 9 through a regression analysis so that a difference between the periodic graph G and the sine wave expressed by Equation 9 is minimized. For example, fitting may be performed by using various error functions such as Mean Squared Error (MSE), Root Mean Squared Error (RMSE), Mean Absolute Error (MAE), Mean Absolute Percentage Error (MAPE), Mean Percentage Error (MPE), and so on.

$$A_0+A_1\cos(\theta_1+f_1 x)+A_2\sin(\theta_2+f_2 x) \qquad \text{[Equation 9]}$$

In Equation 9, $A_1\cos(\theta_1+f_1 x)$ denotes cosine sinusoidal signal model, $A_2\sin(\theta_2+f_2 x)$ denotes sine sinusoidal signal model, $A_O$ denotes direct current (DC) corresponding to the height of the waveform, $A_1$ denotes amplitude associated with cosine sinusoidal signal model, $A_2$ denotes amplitude associated with sine sinusoidal signal model, $\theta_1$ denotes phase associated with cosine sinusoidal signal model, $\theta_2$ denotes phase associated with sine sinusoidal signal model, $f_1$ denotes frequency associated with cosine sinusoidal signal model, $f_2$ denotes frequency associated with sine sinusoidal signal model, and x denotes pixel position.

Then, by using two graphs S expressed as sine waves respectively obtained from the regions $R_1$ and $R_2$, a difference between the X value of the center of the first Moire pattern $M_1$ and the X value of the center of the image of the secured overlay mark is obtained.

If the first center of symmetry $COS_1$ of the first Moire pattern $M_1$ and the X value of the center of the image COI of the obtained overlay mark are the same, two graphs S may have the same shape. If the first center of symmetry $COS_1$ of the first Moire pattern $M_1$ and the X value of the center of the image COI of the obtained overlay mark are not the same, one graph may have an offset shape in the X-axis direction with respect to the other graph. An offset value at this time represents a difference between the X value of the center of the first Moire pattern $M_1$ and the X value of the center of the image COI of the obtained overlay mark.

Next, a difference between an X value of the second center of symmetry $COS_2$ of the second Moire pattern $M_2$ and an X value of a center of image COI of an obtained Moire pattern is obtained.

Next, by using the difference between the X value of the first center of symmetry $COS_1$ of the first Moire pattern $M_1$ and the X value of the center of the image of the obtained overlay mark and the difference between the X value of the second center of symmetry $COS_2$ of the second Moire pattern $M_2$ and the X value of the center of the image of the obtained overlay mark, an overlay value in the X-axis direction is obtained.

The difference value is a value magnified by the Moire gain value, so that an actual overlay value in the X-axis direction may be obtained by dividing the difference value by the Moire gain value.

Next, by using the same method, a difference between a Y value of the third center of symmetry $COS_3$ of the third Moire pattern $M_3$ and a Y value of a center of image COI of an obtained Moire pattern is obtained. Next, a difference between a Y value of the fourth center of symmetry $COS_4$ of the fourth Moire pattern $M_4$ and a Y value of a center of image COI of an obtained Moire pattern is obtained.

Next, by using the difference between the Y value of the third center of symmetry $COS_3$ of the third Moire pattern $M_3$ and the Y value of the center of the image of the obtained overlay mark and the difference between the Y value of the fourth center of symmetry $COS_4$ of the fourth Moire pattern $M_4$ and the Y value of the center of the image of the obtained overlay mark, an overlay value in the Y-axis direction is obtained. The difference value is a value magnified by the Moire gain value, so that an actual overlay value in the Y-axis direction may be obtained by dividing the difference value by the Moire gain value.

Hereinafter, a manufacturing method of a semiconductor device by using the overlay mark 10 illustrated in FIG. 1 will be described. The manufacturing method of the semiconductor device by using the overlay mark 10 starts with a process of forming the overlay mark 10. The overlay mark 10 is formed simultaneously with forming two consecutive pattern layers.

The process of forming the overlay mark 10 may be a process of forming the overlay mark 10 by using an exposure apparatus in a scanner type. Then, at this time, a scanning direction of the exposure apparatus is preferably parallel to longitudinal directions (the Y-axis direction in FIG. 3) of thin bars constituting the grating patterns 110, 120, 210, and 220 of the first and second overlay marks 100 and 200. This is because a speed can be controlled at a constant speed in the scanning direction of the exposure apparatus, so a distortion of the thin bars in the Y-axis direction is not large but a distortion in the X-axis direction may occur, so that it is preferable that the thin bars disposed along the X-axis direction that is perpendicular to the scanning direction is disposed on the center portion so as to minimize the distortion.

Next, an overlay value is measured by using the overlay mark 10. A process of measuring the overlay value is the same as described in the overlay measurement method described above.

Finally, the measured overlay value is used in a process control for forming two consecutive pattern layers or forming two patterns separately formed on one pattern layer. That is, the derived overlay value in the process control is utilized so that the consecutive pattern layers or the two patterns are formed at a predetermined position.

The embodiments described above are merely to describe preferred embodiments of the present disclosure, and the scope of the present disclosure is not limited to the described embodiments. In addition, various changes, modifications, or substitutions may be made by those skilled in the art within the spirit and claims of the present disclosure, and such embodiments should be regarded as falling within the scope of the present disclosure.

What is claimed is:

1. An overlay mark for measuring an overlay based on an image, the overlay mark being configured to determine a relative misalignment between at least two pattern layers, and the overlay mark comprising:
   first to fourth overlay marks,
   wherein the first overlay mark is configured such that a pair of first Moire patterns is formed, the pair of first Moire patterns having a first center of symmetry and being rotationally symmetrical by 180 degrees with respect to the first center of symmetry, and the pair of first Moire patterns having central axes that coincide with each other and being disposed on a center portion of the overlay mark, and
   the first Moire patterns are formed by a first grating pattern, which is formed together with a first pattern layer and which has a first pitch along a first direction, and by a second grating pattern, which is formed together with a second pattern layer so as to overlap the first grating pattern and which has a second pitch along the first direction in which the second pitch is different from the first pitch,
   wherein the second overlay mark is configured such that a pair of second Moire patterns is formed, the pair of second Moire patterns having a second center of symmetry and being rotationally symmetrical by 180 degrees with respect to the second center of symmetry, and the pair of second Moire patterns having central axes that coincide with each other and being disposed so as to face each other with the first Moire patterns interposed therebetween, and
   the second Moire patterns are formed by a third grating pattern, which is formed together with the first pattern layer and which has a third pitch along the first direction, and by a fourth grating pattern, which is formed together with the second pattern layer so as to overlap the third grating pattern and which has a fourth pitch along the first direction in which the fourth pitch is different from the third pitch,
   wherein the third overlay mark is configured such that a pair of third Moire patterns is formed, the pair of third Moire patterns having a third center of symmetry and being rotationally symmetrical by 180 degrees with respect to the third center of symmetry, and the pair of third Moire patterns being disposed on a first diagonal line with the first Moire patterns interposed therebetween, and the third Moire patterns are formed by a fifth grating pattern, which is formed together with the first pattern layer and which has a fifth pitch along a second direction, and by a sixth grating pattern, which is formed together with the second pattern layer so as to overlap the fifth grating pattern and which has a sixth pitch along the second direction in which the sixth pitch is different from the fifth pitch, wherein the fourth overlay mark is configured such that a pair of fourth Moire patterns is formed, the pair of fourth Moire patterns having a fourth center of symmetry and being rotationally symmetrical by 180 degrees with respect to the fourth center of symmetry, and the pair of fourth Moire patterns being disposed on a second diagonal line with the first Moire patterns interposed therebetween in which the second diagonal line crosses the first diagonal line, and the fourth Moire patterns are formed by a seventh grating pattern, which is formed together with the first pattern layer and which has a seventh pitch along the second direction, and by an eighth grating pattern, which is formed together with the second pattern layer so as to overlap the seventh grating pattern and which has an eight pitch along the second direction in which the eighth pitch is different from the seventh pitch, and wherein an error in the first direction between the first center of symmetry and the second center of symmetry represents an overlay error in the first direction between the first pattern layer and the second pattern layer, and an error in the second direction between the third center of symmetry and the fourth center of symmetry represents an overlay error in the second direction between the first pattern layer and the second pattern layer.

2. The overlay mark of claim 1, wherein the overlay mark is formed by using an exposure apparatus in a scanner type, and the second direction is parallel to a scanning direction of the exposure apparatus.

3. The overlay mark of claim 1, wherein pitches of the first to the fourth Moire patterns are larger than an optical resolution of an overlay measurement apparatus, and the first to the eighth pitches of the first to eighth grating patterns are smaller than the optical resolution of the overlay measurement apparatus.

4. The overlay mark of claim 1, wherein the first pitch is the same as the fourth pitch, and the second pitch is the same as the third pitch.

5. The overlay mark of claim 1, wherein the fifth pitch is the same as the eighth pitch, and the sixth pitch is the same as the seventh pitch.

6. An overlay measurement method measuring an overlay between a plurality of consecutive pattern layers, the overlay measurement method comprising:

obtaining a Moire pattern image formed by an overlay mark that is formed simultaneously with forming the plurality of consecutive pattern layers; and analyzing the Moire pattern image, wherein the overlay mark is the overlay mark according to claim 1.

7. The overlay measurement method of claim 6, wherein:

the obtaining the Moire pattern image includes obtaining the Moire pattern image by using an overlay measurement apparatus including an inclined optical element, and the overlay measurement apparatus is arranged such that a distance between the inclined optical element and the overlay mark increases or decreases in the first direction and the distance is constant in the second direction.

8. The overlay measurement method of claim 7, wherein the inclined optical element is a beam splitter.

9. The overlay measurement method of claim 6, wherein the analyzing the Moire pattern image comprises:

obtaining a periodic graph by one-dimensionally projecting a part of the Moire pattern image; and expressing the periodic graph as a sine wave.

10. The overlay measurement method of claim 9, wherein the expressing the periodic graph as the sine wave is a process of fitting $A_0$, $A_1$, $A_2$, $\theta_1$, $\theta_2$, $f_1$, and $f_2$ values of equation, $$A_0 + A_1 \cos(\theta_1 + f_1 x) + A_2 \sin(\theta_2 + f_2 x)$$

through a regression analysis so that a difference between the periodic graph and the sine wave expressed by Equation is reduced, where $A_1 \cos(\theta_1 + f_{1x})$ denotes cosine sinusoidal signal model, $A_2 \sin(\theta_2 + f_{2x})$ denotes sine sinusoidal signal model, $A_0$ denotes direct current (DC) corresponding to the height of the waveform, $A_1$ denotes amplitude associated with cosine sinusoidal signal model, $A_2$ denotes amplitude associated with sine sinusoidal signal model, $\theta_1$ denotes phase associated with cosine sinusoidal signal model, $\theta_2$ denotes phase associated with sine sinusoidal signal model, $f_1$ denotes frequency associated with cosine sinusoidal signal model, $f_2$ denotes frequency associated with sine sinusoidal signal model, and x denotes pixel position.

11. A manufacturing method of a semiconductor device, the manufacturing method comprising:

forming an overlay mark simultaneously with forming a plurality of consecutive pattern layers;

measuring an overlay value by using the overlay mark; and using the measured overlay value to control for forming the plurality of consecutive pattern layers, wherein the overlay mark is the overlay mark according to claim 1.

12. The manufacturing method of claim 11, wherein the forming the overlay mark includes forming the overlay mark by using an exposure apparatus in a scanner type, and the second direction is parallel to a scanning direction of the exposure apparatus.

* * * * *